US009366705B2

(12) United States Patent
Bagley

(10) Patent No.: US 9,366,705 B2
(45) Date of Patent: Jun. 14, 2016

(54) CONDITION MONITORING BY CROSS-CORRELATION OF SWITCHING-MODE POWER SUPPLIES

(71) Applicant: AKER SUBSEA LIMITED, Maindenhead, Berkshire (GB)

(72) Inventor: Philip Michael Bagley, Aberdeenshire (GB)

(73) Assignee: AKER SUBSEA LIMITED, Berkshire (GB)

( * ) Notice: Subject to any disclaimer, the term of this patent is extended or adjusted under 35 U.S.C. 154(b) by 66 days.

(21) Appl. No.: 14/237,022

(22) PCT Filed: Sep. 21, 2012

(86) PCT No.: PCT/GB2012/000740
§ 371 (c)(1),
(2) Date: Feb. 4, 2014

(87) PCT Pub. No.: WO2013/041831
PCT Pub. Date: Mar. 28, 2013

(65) Prior Publication Data

US 2014/0210451 A1 Jul. 31, 2014

(30) Foreign Application Priority Data

Sep. 21, 2011 (GB) .................................. 1116299.7

(51) Int. Cl.
*G01R 23/02* (2006.01)
*G01R 31/40* (2014.01)

(52) U.S. Cl.
CPC ................ *G01R 23/02* (2013.01); *G01R 31/40* (2013.01)

(58) Field of Classification Search
CPC ........ G01R 23/02; G01R 31/40; G01R 31/42; G01R 23/00; G01R 23/06; G01R 23/10; G01R 23/12; G01R 23/15; G01R 29/26
See application file for complete search history.

(56) References Cited

U.S. PATENT DOCUMENTS 5,777,512 A * 7/1998 Tripathi et al. ........... 330/207 A
2005/0285619 A1* 12/2005 Williams ............ H02M 3/1584 324/764.01
2006/0015274 A1* 1/2006 Trandafir et al. ............... 702/64
2007/0007970 A1 1/2007 Neuman (Continued)

FOREIGN PATENT DOCUMENTS

EP 1 533 624 5/2005
WO WO 90/04187 4/1990

OTHER PUBLICATIONS

International Search Report for PCT/GB2012/000740, mailed Dec. 18, 2012.

(Continued)

*Primary Examiner* — Tung X Nguyen
*Assistant Examiner* — David Frederiksen
(74) *Attorney, Agent, or Firm* — Nixon & Vanderhye P.C.

(57) ABSTRACT

A method of monitoring an output signal of a switching-mode power supply for the presence and magnitude of the switching frequency comprises sampling the output signal at a sampling frequency above the minimum Nyquist limit to provide a succession of samples; cross-correlating a reference signal and the samples to provide cross-correlation values; and monitoring the cross-correlation values to ascertain the magnitude of a component of the output signal at or near the frequency of the reference signal.

11 Claims, 2 Drawing Sheets

(56) References Cited

U.S. PATENT DOCUMENTS

| | | | | |
|---|---|---|---|---|
| 2007/0086544 | A1* | 4/2007 | Fudge et al. | 375/316 |
| 2007/0177515 | A1* | 8/2007 | Zhou et al. | 370/241 |
| 2007/0219749 | A1 | 9/2007 | Jayabalan et al. | |
| 2008/0010474 | A1* | 1/2008 | Chapuis | H02M 3/157 713/300 |
| 2008/0218195 | A1 | 9/2008 | Kajita | |
| 2008/0252280 | A1* | 10/2008 | Prodic | H02M 3/157 323/283 |
| 2009/0027937 | A1* | 1/2009 | Kirchmeier et al. | 363/133 |
| 2009/0160259 | A1* | 6/2009 | Naiknaware et al. | 307/82 |
| 2009/0198460 | A1 | 8/2009 | Carroll et al. | |
| 2011/0234255 | A1* | 9/2011 | Chobot | G01R 31/40 324/764.01 |
| 2012/0098553 | A1* | 4/2012 | Karlsson | G01R 27/2605 324/684 |
| 2012/0182003 | A1* | 7/2012 | Flaibani | H02M 3/156 323/284 |

OTHER PUBLICATIONS

Miao, B. et al., "FPGA-Based Digital Network Analyzer for Digitally Controlled SMPS", Computers in Power Electronics, (Jul. 16, 2006), pp. 240-245.

Miao,B. et al., "System Identification of Power converters with Digital Control Through Cross-Correlation Methods", IEEE Transactions on Power Electronics, vol. 20, No. 5, (Sep. 1, 2005), pp. 1093-1099.

Miao, B. et al., "Practical on-line identification of power converter dynamic responses", Applied Power Electronics Conference and Expostion 2005, vol. 1, (Mar. 6, 2005), pp. 57-62.

Miao, B. et al., "A modified cross-correlation method for system identification of power converters with digital control", Power Electronics Specialists Conference, 2004, (Jun. 20, 2004), p. 3728.

* cited by examiner

CONDITION MONITORING BY CROSS-CORRELATION OF SWITCHING-MODE POWER SUPPLIES

This application is the U.S. national phase of International Application No. PCT/GB2012/000740, filed 21 Sep. 2012, which designated the U.S. and claims priority to GB Application No. 1116299.7, filed 21 Sep. 2011, the entire contents of each of which are hereby incorporated by reference.

FIELD OF THE INVENTION

This invention relates to the condition monitoring of switching-mode power supplies for use in the supply of electrical power to subsea installations.

BACKGROUND TO THE INVENTION

In recent years attention has been given to the monitoring of systems in order to provide an indication of impending degradation or failure in order that remedial action may be made before actual failure occurs. The general problems are the selection of an appropriate parameter of performance or condition and the selection of an appropriate technique for monitoring changes in that parameter.

Power supplies are a ubiquitous part of any electrical or electronic system. They condition an input to supply electrical energy to a load. Historically, power supplies were of a linear type utilising electronic components operating in their linear regions. However, this technology is known to be inefficient. Linear power supply technology, although still used, has largely been superseded by switching mode power supply systems, in which power is dissipated for the most part only when solid state switches such as transistors are transitioning between their 'on' and 'off' states. Such systems are therefore very efficient when compared to 'linear' power supplies. Typically, the switching frequencies are high (50 kHz to 1 Mhz), allowing the use of small components that result in a very compact power supply.

In subsea systems the 'topside' power supply is often designed as an uninterruptible power supply (UPS), wherein an input supply is conditioned and used to charge batteries. The batteries then supply power to a switching regulator that conditions the supply into a suitable form for use subsea. Switching mode power supplies may also be used in subsea power supplies to convert the umbilical supply into lower voltages for subsea electronic modules and, for example, the operation of actuators for valves.

Historically, faults in capacitors have been the primary cause of power supply failures. Even with improved manufacturing processes, capacitors continue to cause failures. The lifetime of a capacitor is dependent on voltage, current, and temperature stresses to which it is subjected during its service life. These effects are substantially greater in power supplies than in low-voltage signal processing circuits. As a capacitor ages, its series resistance will tend to increase, resulting in localised heating and thence to localised arcing, that ultimately is liable to cause breakdown of a metallized film dielectric. This dielectric breakdown will result in a 'hard' short circuit or open circuit condition and capacitor failure. However, before failure occurs, increase in the series resistance affects the performance of the capacitor and thereby in turn will affect the performance of the output filter of the switching mode power supply.

Switching power supplies have carefully designed filters that remove as much of the switching frequency from the output as is practically possible. If the performance of the filter reduces because of a capacitor's degradation, more of the switching frequency will appear in the power supply's output voltage than is specified by the manufacturer. Therefore, as the power supply ages, so the amplitude of the switching frequency in the output will increase.

State Of The Art

It is known from US2008/018195 A1 to measure noise in a power supply circuit by generating a sine wave of variable frequency and amplitude and cross-correlating this signal with the noise from the power supply. Other documents which employ cross-correlation in different contexts are U.S. Pat. Nos. 4,430,611 and 6,424,138-B1, which describe spectrum analysers, the document US2004/0206170 A1, which describes the detection of torsional vibrations, and the document EP-1533624-A1, which describes cross-correlation between a test signal and an output signal of an electrical circuit.

SUMMARY OF EXAMPLE EMBODIMENTS

The present invention particularly concerns a technique for monitoring the condition of is switching-mode power supply in reliance on the increase of the switching frequency component(s) in the output of the supply.

The basis of the example embodiment is a method of monitoring an output of a switching-mode power supply operating at a known switching frequency, comprising: sampling the output of the power supply at a sampling frequency above the minimum Nyquist limit to provide a succession of samples; cross-correlating a reference signal at the switching frequency and the said samples to provide cross-correlation values; and monitoring the cross-correlation values to ascertain the magnitude of a component of the output signal at or near the switching frequency.

Preferably the cross-correlation values are in or are converted to the frequency domain signal and the monitoring comprises detecting the magnitude of a component or components within a particular frequency range. The monitoring may employ a plurality of different thresholds for the said magnitude.

The sampling frequency may be at least ten times the highest frequency in the output of the switching-mode power supply.

The invention extends to a switching mode power supply operating at a known switching frequency, comprising: a series switch; a source of a switching signal operating the switch at a switching frequency; an inductor in series with the switch; a shunt diode forming a loop with the inductor and a load; an output filter; means for sampling the output of the power supply at a sampling frequency above the minimum Nyquist limit to provide a succession of samples; means for cross-correlating a reference signal at the switching frequency and the said samples to provide cross- correlation values; and means for monitoring the cross-correlation values to ascertain the magnitude of a component of the output signal at or near the switching frequency.

DETAILED DESCRIPTION

Figure 1:
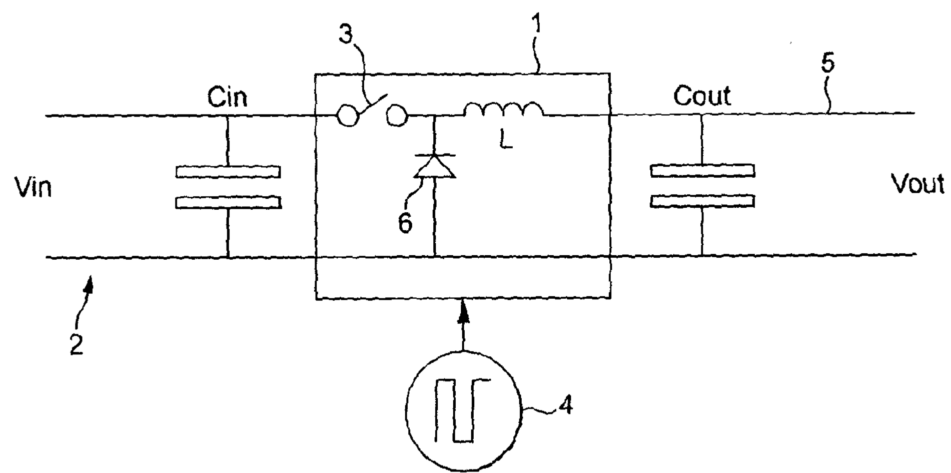
FIG. 1 is a schematic representation of a switching-mode power supply

FIG. 1 shows a general overview of a switching-mode power supply. There are several different standard designs available. For the purposes of this description a buck design in a basic form is used to illustrate the operation of the switching-mode power supply. The switching circuit 1 receives on input lines 2 an input power signal Vin and is represented by a series switch 3 which is controlled by a switching signal from a source 4 at a predetermined frequency. An input filter represented by a capacitor Cin filters input harmonics and controls the power factor. The switching action, controlled by the switching frequency, provides a stream of pulses on output lines 5 to a load (not shown). The pulse stream is regulated (by the shunt diode 6) and then filtered by the output filter constituted by the series inductor L and the shunt capacitor Cout. The shunt diode provides with the inductor a free-wheeling loop around which current can flow through the load when the switch is open.

The filter represented in FIG. 1 by the capacitor Cout performs the important functions of filtering out the switching frequency, reducing harmonic distortion on the output voltage, and supplying power to the load, which may be reactive.

It should be understood that FIG. 1 shows a switching-mode power supply in its basic form. In practice the circuit is more complex. There may be a multiplicity of switches in parallel which are connected in series with the load. The filters at both the input and the output may be more complex in order to provide compensation for various effects particularly when coupling transformers are employed.

The filtration is normally configured to remove as much of the switching signal components as feasible. A power spectrum (PS) plot represents a time domain signal in the frequency domain and depicts the proportion of signal power falling within given frequency range or 'bin'. Therefore in the frequency domain, as a switching power supply ages, so the power of the switching frequency will increase in the associated frequency 'bin'. This increase can be measured and limits or thresholds can be set (through detailed knowledge of the performance of the power supply usually gained through accelerated testing) to detect the switching frequency power increase and to predict failure before actual failure occurs.

Figure 2A:
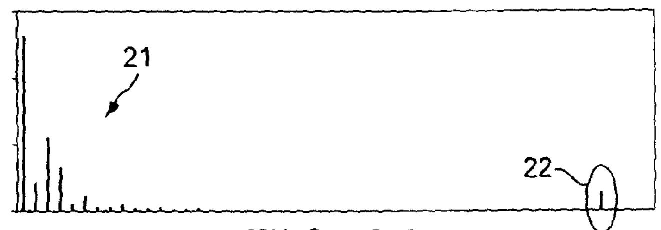
FIGS. 2A to 2C illustrate various frequency spectra.

FIG. 2A is a diagram of the frequency spectrum (magnitude M against frequency f) of the output of the power supply. The spectrum comprises components 21 at or near zero frequency and what should be a small component 22 (encircled) at the switching frequency. Some designs provide for variation of the switching frequency within a small range.

Figure 2B:
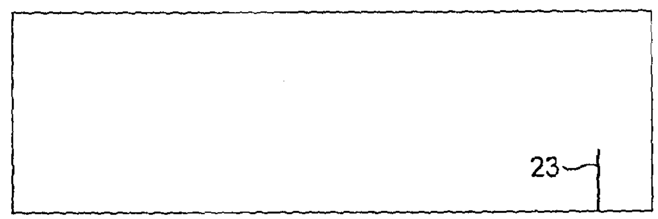

FIG. 2B is a diagram of the frequency spectrum of the switching source 4. It comprises (for example) a single dominant component 23. Harmonics of the switching frequency which are necessarily present by virtue of the wave shape employed have been omitted.

Figure 2C:
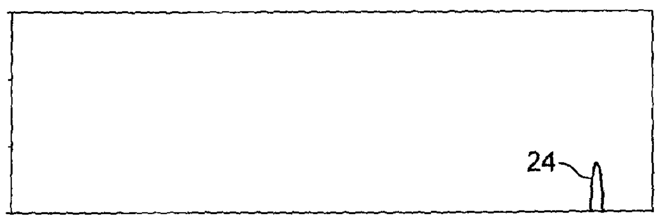

FIG. 2C shows a Fourier cross-spectrum obtained by cross-correlating the output of the switching-mode power supply and the known switching signal. It will show a peak 24 dependent on the magnitude of the switching frequency component in the output of the switching-mode power supply. Monitoring the of the magnitude of this peak will provide an indication of degradation of components of the switching-mode power supply, particularly of a capacitor in the output filter.

Figure 3:
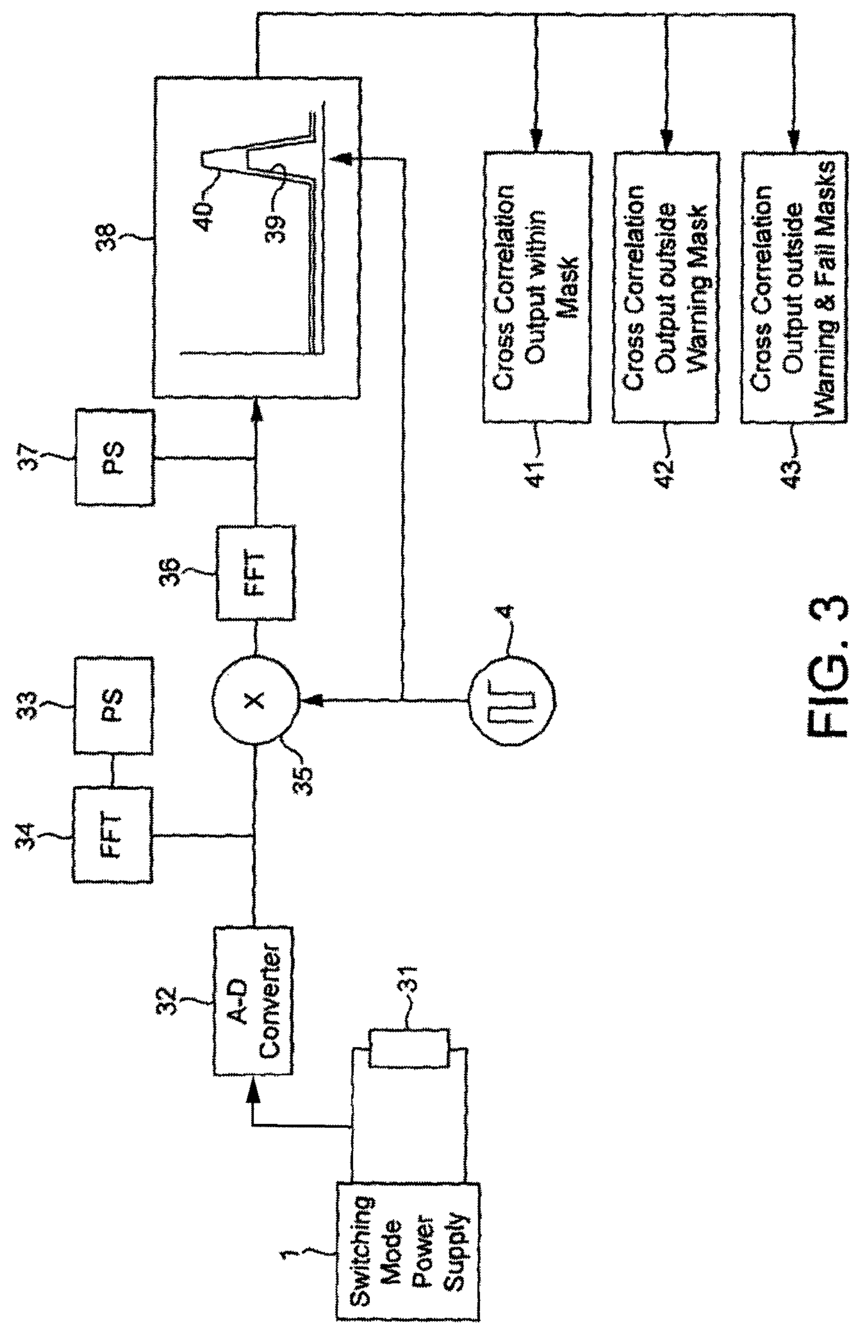
FIG. 3 is a schematic representation of one example of the invention.

FIG. 3 shows a practical implementation of the technique. The switching-mode power supply 1 as shown by way of example in FIG. 1 provides an output to a load 31. The output voltage of the switching-mode power supply 1 is sampled, using a sampling frequency substantially above the minimum Nyquist limit and preferably at for example at ten times the highest frequency of interest, with an analogue to digital converter 32 controlled by a sampling clock (not shown). The power spectrum (PS) can be observed on a display 33 at this point if required by transforming to the frequency domain by a stage 34 using a discrete Fourier transform, preferably a Fast Fourier Transform (FFT).

The sampled output of the switching-mode power supply is then cross correlated with the known switching frequency by means of a cross-correlator 35. This may be of known form. Some switching-mode power supplies use either single or variable switching frequencies. In either case the sampled time domain signal can be cross correlated with the known single frequency or band of frequencies within the known limits of the variable frequencies. The cross-correlation technique is highly sensitive and will produce an amplified output at the switching frequency if the switching-mode power supply has switching frequency components in its output. The larger the amplitude of the switching frequency component in the output of the power supply; the larger is the magnitude of the cross-correlation output.

The output of the cross-correlator is transformed to the frequency domain by a stage 36 using a discrete Fourier transform, preferably a fast Fourier Transform (FFT). The power spectrum (PS) of the signal can be observed on a display 37 at this point if required.

The stage 38 represents a set of masks which perform both frequency and amplitude discrimination. Two masks 39 and 40 are schematically represented in stage 38. Each is set around the frequency bin containing the power supply switching frequency (or frequencies) of the cross-correlation power spectrum. However, they are set to provide a respective indication when the peak within the frequency range (i.e. in the vicinity of the switching frequency) exceeds a respective threshold. These indications obtained by the masking stage 38 may control the stages 41 to 43. The source 4 may provide a reference signal for selection of the correct masks for the desired frequency bin.

Stage 41 indicates that the cross-correlation output in the respective range is within the lower masking threshold (mask 39) and thereby indicates that the power supply condition is satisfactory.

Stage 42 indicates that the cross-correlation output in the respective range is above the lower masking threshold but below the upper masking threshold (mask 40). This condition may be regarded as a warning of deterioration which is not yet unsatisfactory.

Stage 43 indicates that the cross-correlation output in the respective range is above the upper masking threshold. This condition may be regarded as a failure mode which warrants immediate remedial action.

Although the masking technique requires at least one masking threshold, the number of masking thresholds and their magnitudes may be varied according to preference.

For simplicity the process of converting a waveform from the time domain to the frequency domain in a form that is suitable for display on a power spectrum chart or as an input to the masking stage is shown as FFT. In actuality a Fast Fourier Transform (FFT) of a time domain signal will result in a two sided complex form. For this example the complex form may transformed to a single sided power spectrum. The phase information may be ignored.

Further, for simplicity the switching source 4 is shown as feeding directly into the cross-correlator 35. However, in practice the switching frequency may be sampled by an A-D converter at the same frequency as the output of the switching-mode power supply.

Moreover, the cross-correlation may be performed in the time (direct) domain or frequency domain. For small data sets the time domain is more efficient, and for large data sets the frequency domain is more efficient. FIG. 3 shows the time domain cross correlation for simplicity.

The reference signal at or in the vicinity of the switching frequency for use in the cross-correlation may be obtained directly from the source 4 or may be separately generated.

The invention claimed is:

1. A method of condition monitoring a switching-mode power supply providing electrical power to a subsea installation by monitoring an output signal of a switching-mode power supply operating at a known switching frequency and disposed at a subsea location, method comprising:

- sampling the output signal of a subsea located switching-mode power supply at a sampling frequency above a minimum Nyquist limit to provide a succession of samples;
- cross-correlating (a) a reference signal at the known switching frequency and (b) said succession of samples to provide cross-correlation values;
- monitoring the cross-correlation values to ascertain a magnitude of a component of the output signal at or near the known switching frequency; and
- providing an indication of impending power supply degradation or failure if said ascertained magnitude exceeds a predetermined threshold.

2. A method according to claim 1 in which the cross-correlation values are in, or are converted to, a frequency domain signal, and the monitoring comprises detecting a magnitude of a component or components within a particular frequency range of the frequency domain signal.

3. A method according to claim 2 in which the monitoring employs a plurality of different thresholds for said magnitude.

4. A method according to claim 3 in which the known sampling frequency is at least ten times a highest frequency in the output signal.

5. A method according to claim 1 wherein the reference signal is independent of the output signal.

6. A subsea switching-mode power supply configured to be disposed subsea and to operate at a known switching frequency, said power supply comprising:

- a series switch;
- a source of a switching signal operating the switch at the known switching frequency;
- an inductor in series with the switch;
- a shunt diode forming a loop with the inductor and a load;
- an output filter;
- means for sampling an output signal of the switching-mode power supply at a sampling frequency above a minimum Nyquist limit to provide a succession of samples during subsea operation;
- means for cross-correlating (a) to reference signal during subsea operation at the known switching frequency and (b) said succession of samples to provide cross-correlation values;
- means for monitoring during subsea operation the cross-correlation values to ascertain a magnitude of a component of the output signal during subsea operation at or near the known switching frequency; and
- means for indicating impending power supply degradation or failure during subsea operation if said ascertained magnitude exceeds a predetermined threshold.

7. The switching-mode power supply of claim 6, wherein said means for indicating is configured to apply a plurality of masks to determine whether said magnitude exceeds at least one of a plurality of different thresholds.

8. The switching-mode power supply of claim 6, wherein said output filter includes a capacitor of which a condition is represented by said magnitude.

9. A subsea switching-mode power supply according to claim 6 wherein the reference signal is independent of the output signal.

10. A method of condition monitoring a condition of a capacitor of an output filter of a subsea switching-mode power supply supplying electrical power to a subsea installation and operating at a known switching frequency, said method comprising:

- sampling an output signal of said subsea switching-mode power supply at a sampling frequency above a minimum Nyquist limit to provide a succession of samples;
- cross-correlating (a) a reference signal during subsea operation of the power supply at said known switching frequency and (b) said succession or samples to provide cross-correlation values;
- monitoring said cross-correlation values during subsea operation of said power supply to ascertain a magnitude of a component of said output signal at or near the known switching frequency, said magnitude representing the condition of said capacitor, and
- indicating impending power supply degradation or failure during subsea operation of said power supply if said ascertained magnitude exceeds a predetermined threshold.

11. A method according to claim 10 wherein the reference signal is independent of the output signal.

* * * * *